US012699428B2

(12) United States Patent
Wen et al.

(10) Patent No.: US 12,699,428 B2
(45) Date of Patent: Aug. 4, 2026

(54) LAPTOP COMPUTER

(71) Applicant: Acer Incorporated, New Taipei City (TW)

(72) Inventors: Chun-Hung Wen, New Taipei City (TW); Hui-Ping Sun, New Taipei City (TW); Chun-Hsien Chen, New Taipei City (TW); Jui-Yi Yu, New Taipei City (TW); Yen-Chou Chueh, New Taipei City (TW)

(73) Assignee: Acer Incorporated, New Taipei City (TW)

( * ) Notice: Subject to any disclaimer, the term of this patent is extended or adjusted under 35 U.S.C. 154(b) by 169 days.

(21) Appl. No.: 18/416,917

(22) Filed: Jan. 19, 2024

(65) Prior Publication Data

US 2025/0053210 A1      Feb. 13, 2025

(30) Foreign Application Priority Data

Aug. 11, 2023    (TW) .................................. 112130210

(51) Int. Cl.
G06F 1/16 (2006.01)
G06F 1/20 (2006.01)
H05K 7/20 (2006.01)
(52) U.S. Cl.
CPC ............ G06F 1/203 (2013.01); G06F 1/1618 (2013.01); H05K 7/20172 (2013.01)

(58) Field of Classification Search
None
See application file for complete search history.

(56) References Cited

U.S. PATENT DOCUMENTS

2013/0286589 A1* 10/2013 Yang ........................ G06F 1/203
                                                        361/720
2023/0066801 A1    3/2023 Lin et al.

FOREIGN PATENT DOCUMENTS

TW       202019267      5/2020
TW       202044962 A  * 12/2020 ............... G06F 1/16
TW       I715324       1/2021
TW       I790009       1/2023

* cited by examiner

*Primary Examiner* — Imani N Hayman
*Assistant Examiner* — Rashen E Morrison
(74) *Attorney, Agent, or Firm* — JCIPRNET

(57) ABSTRACT

A laptop computer including a host, a movable door, a display, an input module, and a fan is provided. The host has a first surface and a second surface opposite to each other. The movable door is disposed on the second surface. The display is pivoted to the host to be folding on the first surface or unfolding from the first surface. The input module is disposed on the first surface. The fan is disposed in the host, and the movable door covers the fan. When the movable door is removed from the fan, an impeller of the fan is exposed from the host via the second surface.

15 Claims, 12 Drawing Sheets

LAPTOP COMPUTER

CROSS-REFERENCE TO RELATED APPLICATION

This application claims the priority benefit of Taiwan application serial no. 112130210, filed on Aug. 11, 2023. The entirety of the above-mentioned patent application is hereby incorporated by reference herein and made a part of this specification.

BACKGROUND

Technical Field

The disclosure relates to a laptop computer.

Description of Related Art

Electronic devices such as laptop computers generate a lot of heat during operation, and the temperature rises. If the temperature cannot be dissipated quickly, it will not only easily cause the device to crash, but also reduce the service life of the components in the high temperature environment for a long time. In order to maintain the temperature of the electronic device within a normal range, it is a common practice in the industry to dispose fans or heat dissipation fins in the electronic device to help dissipate the heat.

However, regardless of the fan or the heat dissipation fin, after long-term use, a large amount of dust will accumulate on an impeller of the fan or the heat dissipation fin, thereby affecting the heat dissipation effect. Among the existing solutions, those with better cleaning effect still rely on dismantling the fan for manual cleaning. However, this action makes the user have to face the complicated process of disassembling and assembling the electronic device (such as the foregoing laptop computer), which reduces the user's sense of operation and experience.

SUMMARY

The disclosure provides a laptop computer, which provides a simple housing structure and facilitates an operation of a user to clean an inside of a machine body.

A laptop computer in the disclosure includes a host, a movable door, a display, an input module, and a fan. The host has a first surface and a second surface opposite to each other. The movable door is disposed on the second surface. The display is pivoted to the host to be folding on the first surface or unfolding from the first surface. The input module is disposed on the first surface. The fan is disposed in the host, and the movable door covers the fan. After the movable door is removed from the fan, an impeller of the fan is exposed from the host via the second surface.

Based on the above, the laptop computer is provided with the movable door on the second surface of the host, and the fans disposed in the host is covered by the movable door. Accordingly, the user may easily operate the movable door to cover the fan or remove it from the fan. After the movable door is removed, the impeller of the fan may be exposed from the host via the second surface, and the user may perform the required cleaning operation on the impeller to improve heat dissipation efficiency of the fan. In other words, due to the configuration of the movable door on the second surface, the host may provide a simple mechanism for the user to clean the fan, and the user does not need to worry about the complicated process of disassembling and assembling the host structure affecting the sense of operation and experience.

DETAILED DESCRIPTION OF DISCLOSED EMBODIMENTS

Figure 1A:
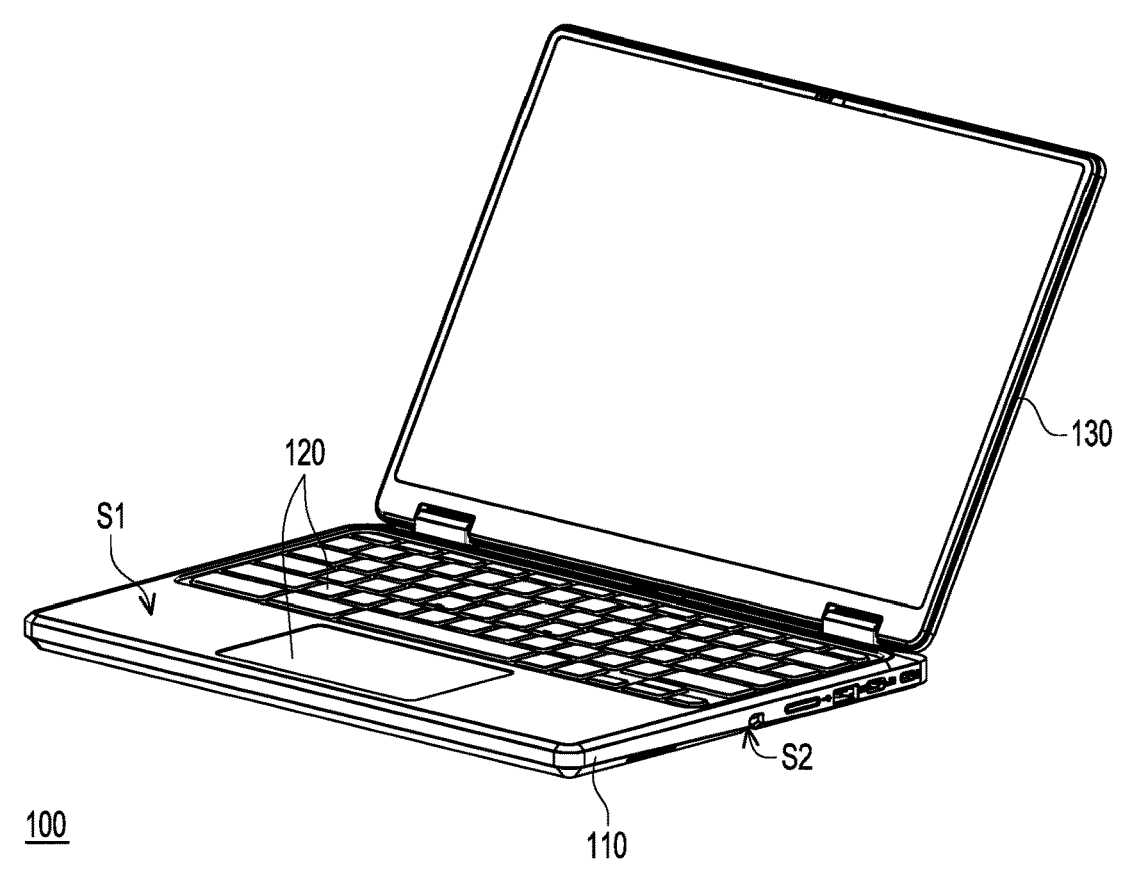
FIG. 1A is a schematic view of a laptop computer according to an embodiment of the disclosure.
Figure 1B:
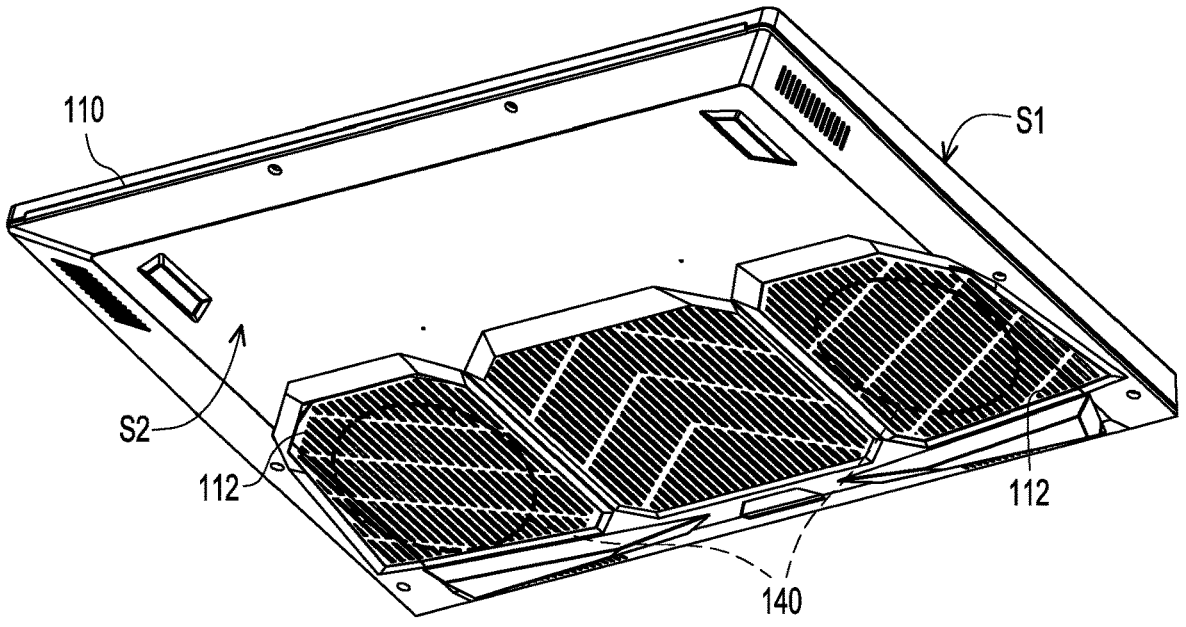
FIG. 1B shows a host of the laptop computer in FIG. 1 from another perspective.

FIG. 1A is a schematic view of a laptop computer according to an embodiment of the disclosure. FIG. 1B shows a host of the laptop computer in FIG. 1 from another perspective, and some components are omitted here. Referring to both FIGS. 1A and 1B, in this embodiment, a laptop computer 100 includes a host 110, a display 130, an input module 120, and a fan 140. The host 110 has a first surface S1 and a second surface S2 opposite to each other. The display 130 is pivoted to the host 110 to be folding on the first surface S1 or unfolding from the first surface S1. The input module 120 includes, for example, a touchpad and a keyboard, which are disposed on the first surface S1. The fan 140 is disposed in the host 110.

Figure 2A:
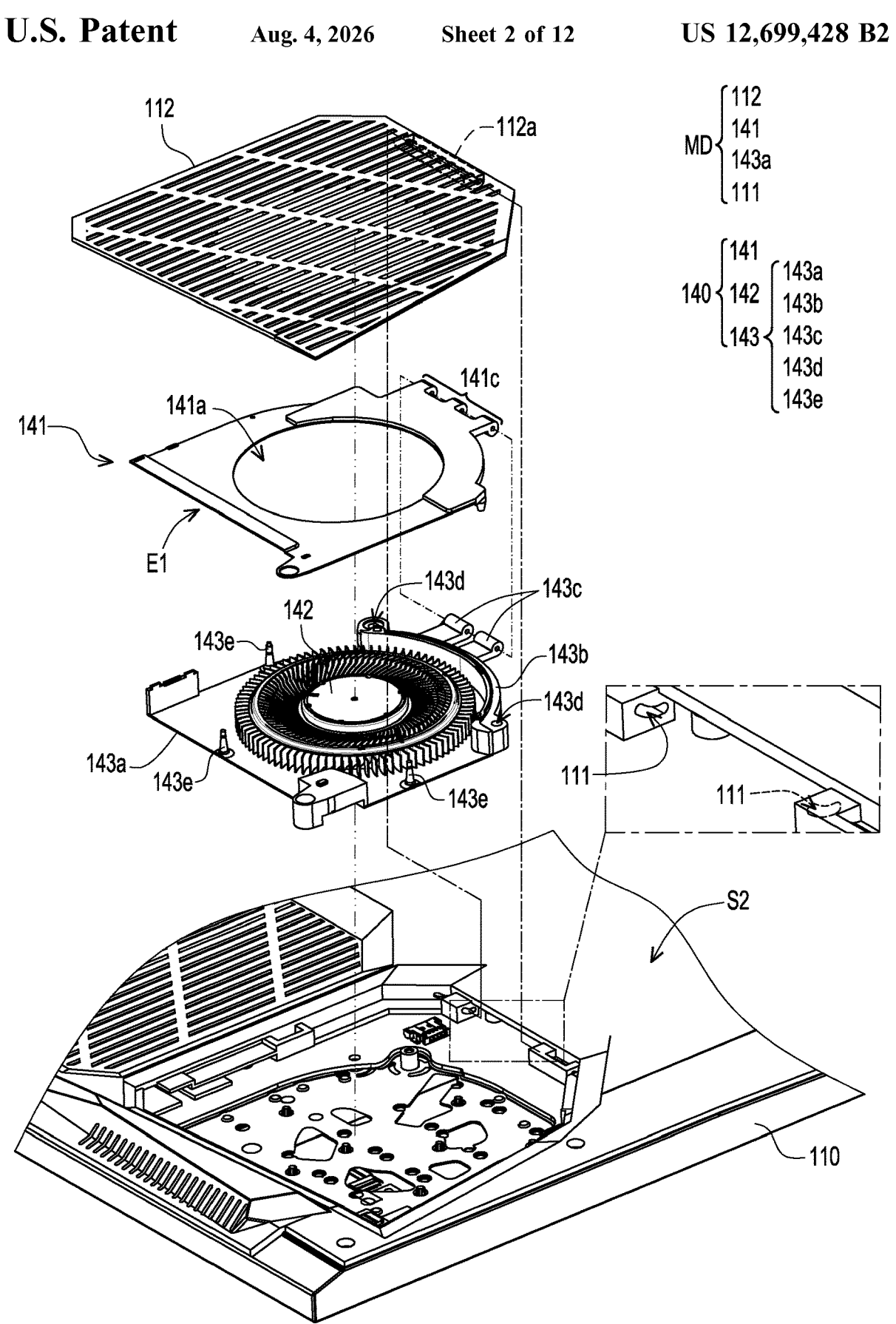
FIG. 2A is an exploded schematic view of the host in FIG. 1B.
Figure 3A:
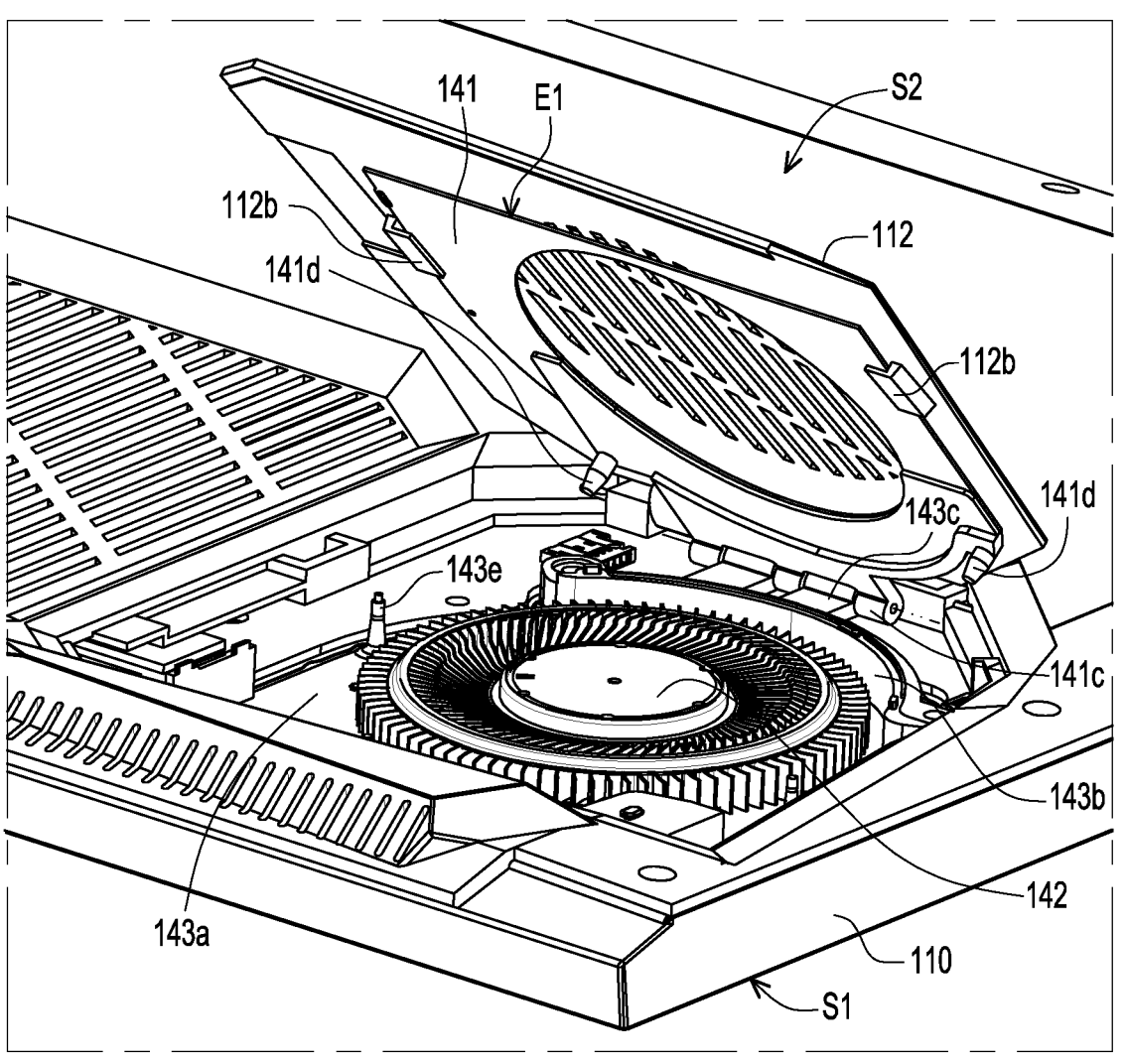
FIG. 3A is a schematic partial view of the host in FIG. 1B in another state.

FIG. 2A is an exploded schematic view of the host in FIG. 1B. FIG. 3A is a schematic partial view of the host in FIG. 1B in another state. Referring to both FIGS. 2A and 3A, the laptop computer 100 in this embodiment further includes a movable door MD disposed on the second surface S2 and configured to cover the fan 140. When the movable door MD is removed from the fan 140, an impeller 142 of the fan 140 is exposed from the host 110 via the second surface S2. In this way, a user may clean or even repair the fan 140 inside the host 110 by opening the movable door MD without considering disassembly and assembly of a structure of the host 110.

Figure 2B:
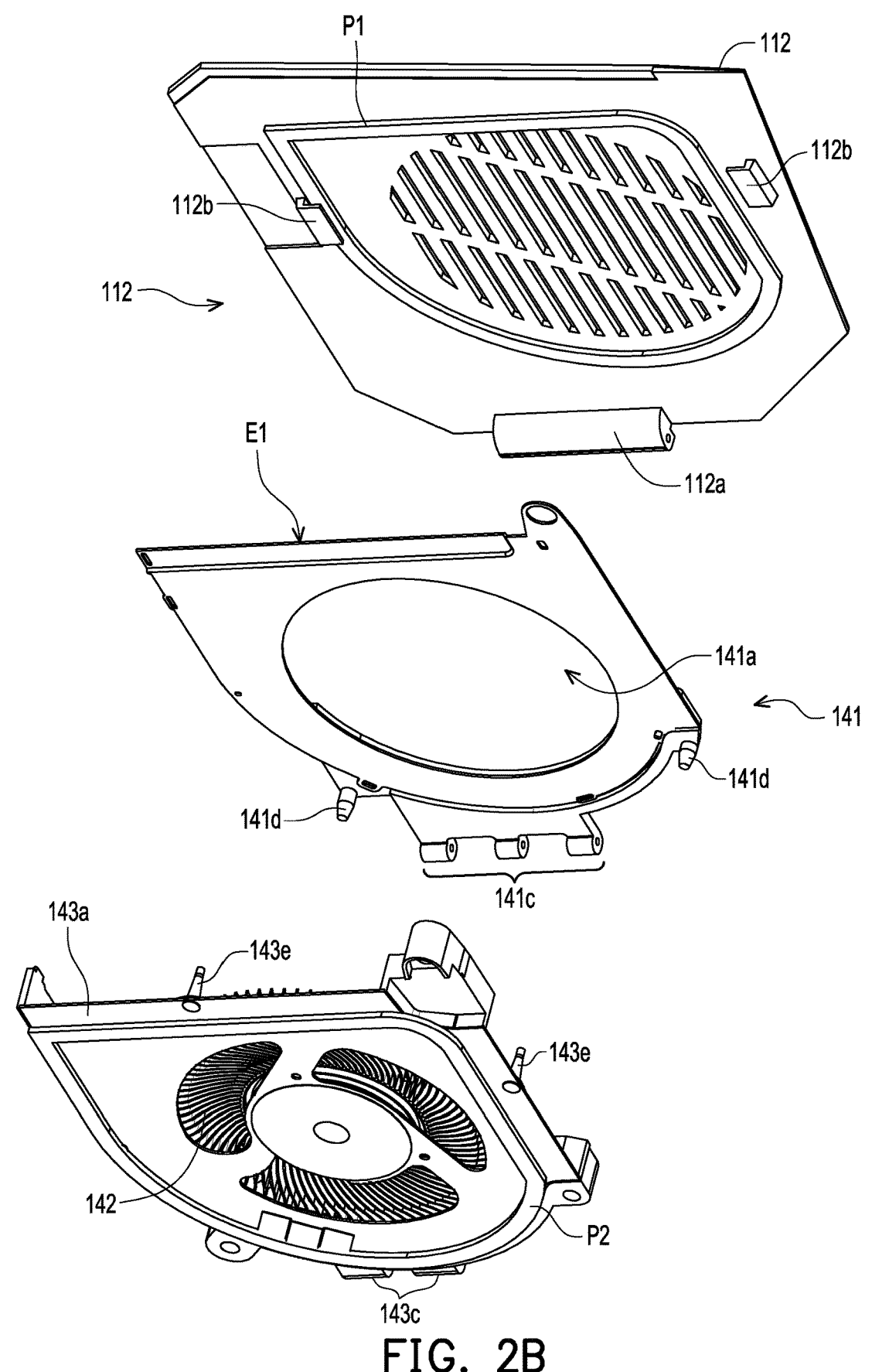
FIG. 2B shows some components in FIG. 2A from another perspective.
Figure 2C:
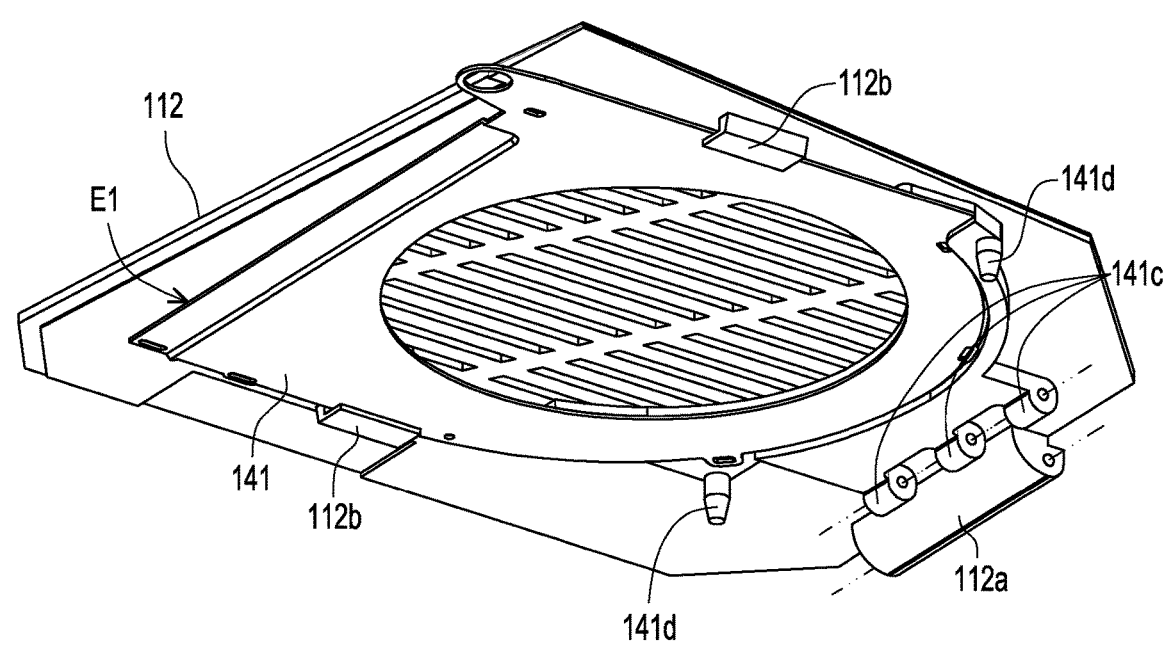
FIG. 2C shows a state where some components in FIG. 2B are stacked.

FIG. 2B shows some components in FIG. 2A from another perspective. FIG. 2C shows a state where some components in FIG. 2B are stacked. Referring to FIGS. 2A to 2C together, in this embodiment, a bottom (that is, at the second surface S2) of the host 110 is provided with a movable first door member 112, which is movably pivoted to an arc track 111 of the host 110. The fan 140 includes a second door member 141, the impeller 142, and a base 143. The impeller 142 is rotatably disposed on the base 143, and the second door member 141 is pivoted to the base 143, so that the movable door MD in this embodiment actually includes the arc track 111, the first door member 112, the second door member 141, and a part of the base 143.

In detail, as shown in FIG. 2A, the first door member 112 has a pivot shaft portion 112*a* configured to be movably pivoted on the arc track 111. As for the fan 140, the base 143 thereof includes a base plate 143*a*, a side wall 143*b*, a pivot shaft portion 143*c*, a positioning hole 143*d*, and a support pillar 143*e*. The side wall 143*b* stands on the base plate 143*a*, and the pivot shaft portion 143*c* extends from the side wall 143*b* in a direction away from the impeller 142, and is configured to be pivoted to a pivot shaft portion 141*c* of the second door member 141. A part of the side wall 143*b* is provided with the positioning hole 143*d*, and the support pillar 143*e* stands on a periphery of the base plate 143*a*.

Figure 2D:
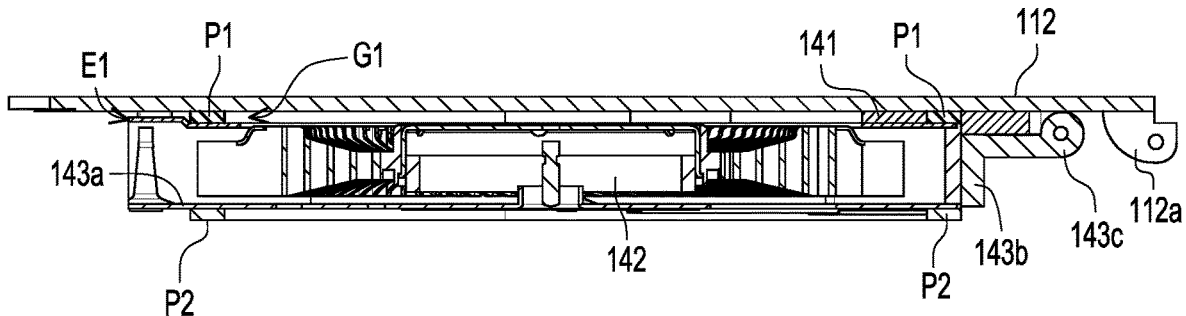
FIG. 2D is a cross-sectional view of some components in FIG. 2A after being combined.

FIG. 2D is a cross-sectional view of some components in FIG. 2A after being combined. Next, referring to FIGS. 2B to 2D, in this embodiment, since a pivotal side of the first door member 112 and a pivotal side of the second door member 141 are actually two different but parallel pivot axes, and they are required to be linked to each other, in this embodiment, an end portion E1 of the second door member 141 away from the pivoted fan 140 is slidably coupled to the first door member 112. Further, as shown in FIGS. 2B and 2C, the first door member 112 has a pair of L-shaped limiting protrusions 112*b*, and two opposite sides of the second door member 141 are movably coupled to the limiting protrusions 112*b*. Accordingly, the second door member 141 is limited by the limiting protrusions 112*b*, and is partially in constant contact with the first door member 112. Furthermore, referring to FIGS. 2A, 2C, and 2D, when the movable door MD is folding on the second surface S2 of the host 110, a buffer member P1 abuts between the first door member 112 and the second door member 141, and a gap G1 is between the first door member 112 and the second door member 141. In other words, the first door member 112 presses the second door member 141 through the buffer member P1. At the same time, referring to FIGS. 2A and 2B, the base 143 of the fan 140 has the positioning hole 143*d*, and the second door member 141 has a positioning pillar 141*d*. Therefore, when the first door member 112 presses the second door member 141 through the buffer member P1, the second door member 141 is fixed to the base 143 through the positioning pillar 141*d* and the positioning hole 143*d* being locked correspondingly to each other. The support pillar 143*e* pushes against the second door member 141 to maintain an air outlet of the fan 140. In contrast, in this embodiment, another buffer member (a buffer member P2) is further used to maintain a gap between the base 143 and the structure of the host 110, so as to ensure that an air flow from another air inlet (as shown in FIG. 2B, the air inlet surrounded by the buffer member P2) may smoothly enter the fan 140. Here, the buffer members P1 and P2 in the disclosure are, for example, rubber gaskets.

In this embodiment, the fan 140 is a centrifugal fan, and the second door member 141 is an upper housing structure of the centrifugal fan and has an air inlet 141*a*. Therefore, a corresponding relationship between the first door member 112, the buffer member P1, the second door member 141, and the base 143 when being folding may not only ensure the space required for the operation of the fan 140 without causing airflow leakage, but the gap G1 between the first door member 112 and the second door member 141 may also effectively provide insulation to the noise generated when the impeller 142 is running.

It should also be mentioned that in order to ensure airtightness of the buffer member P1 between the first door member 112 and the second door member 141, the second door member 141 in this embodiment further has a groove 141*b* away from the impeller 142 to accommodate a part of the buffer member P1.

Figure 3B:
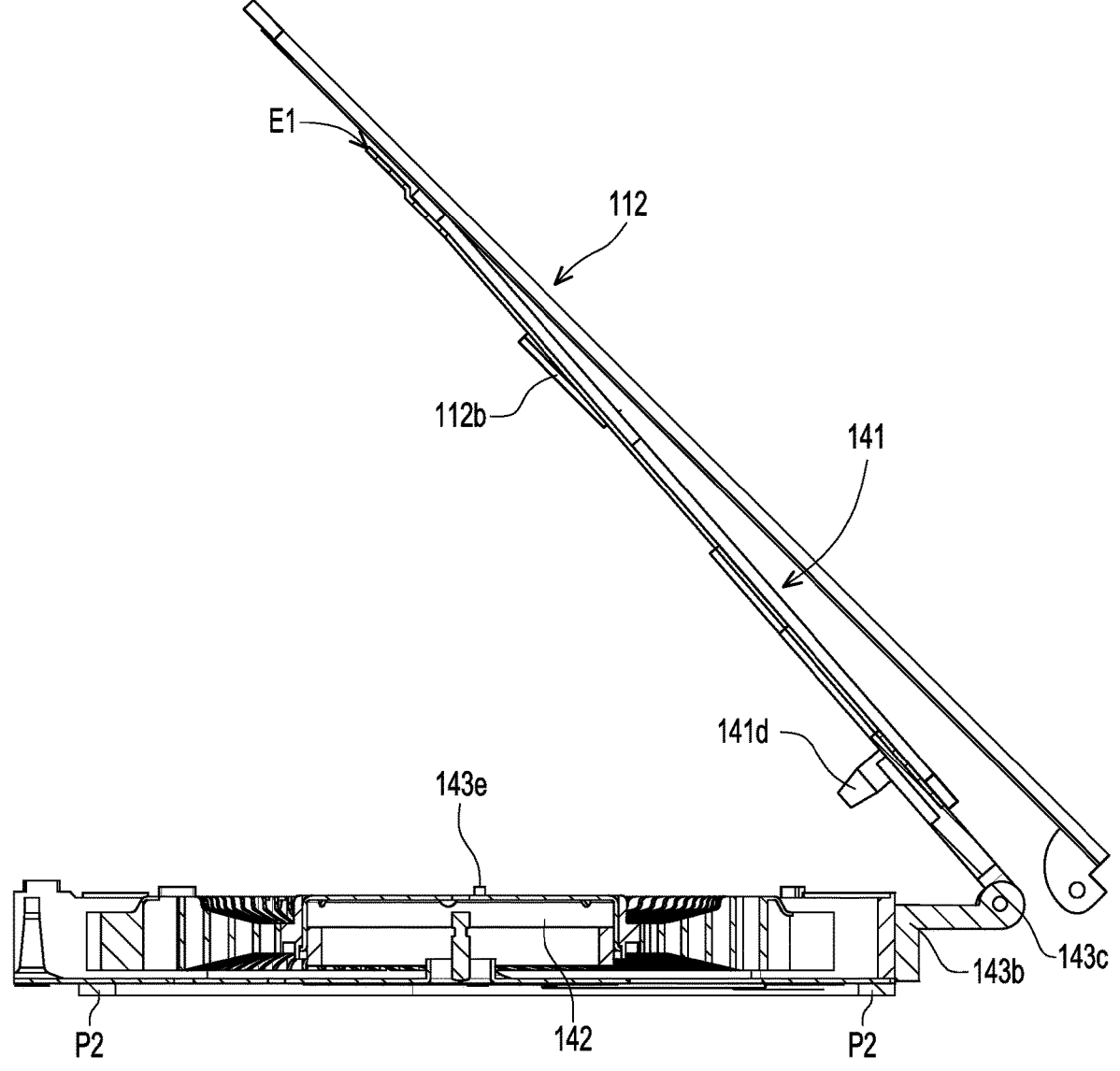
FIG. 3B is a cross-sectional view of some components in FIG. 3A.

FIG. 3B is a cross-sectional view of some components in FIG. 3A. Referring to FIGS. 2D, 3A, and 3B together to provide a comparison of the movable door MD when being folding an unfolding, in this embodiment, sine the first door member 112 and the second door member 141 are in a state of being slidably coupled to each other on an opposite side away from a pivot position, the first door member 112 and the second door member 141 have motion characteristics that may slide relative to each other during a pivoting process, and when the first door member 112 is opened from the second surface S2 of the host 110, the second door member 141 may also be opened to expose the impeller 142 inside. As shown in FIG. 3B, in an unfolding state, the gap G1 between the first door member 112 and the second door member 141 is not equidistant.

Based on the above, the movable door MD includes the first door member 112 and the second door member 141, which are respectively pivoted to the host 110 and the base 143 of the fan 140. A side of the first door member 112 away from a pivot end is further slidingly coupled to a side of the second door member 141 away from the pivot end. In this way, when the user drives the first door member 112, the second door member 141 may also be driven at the same time, so that the impeller 142 of the fan 140 may be exposed from the host 110 via the second surface S2 when the movable door MD is opened, and that the user only needs to open the movable door MD to clean the impeller 142.

Figure 4A:
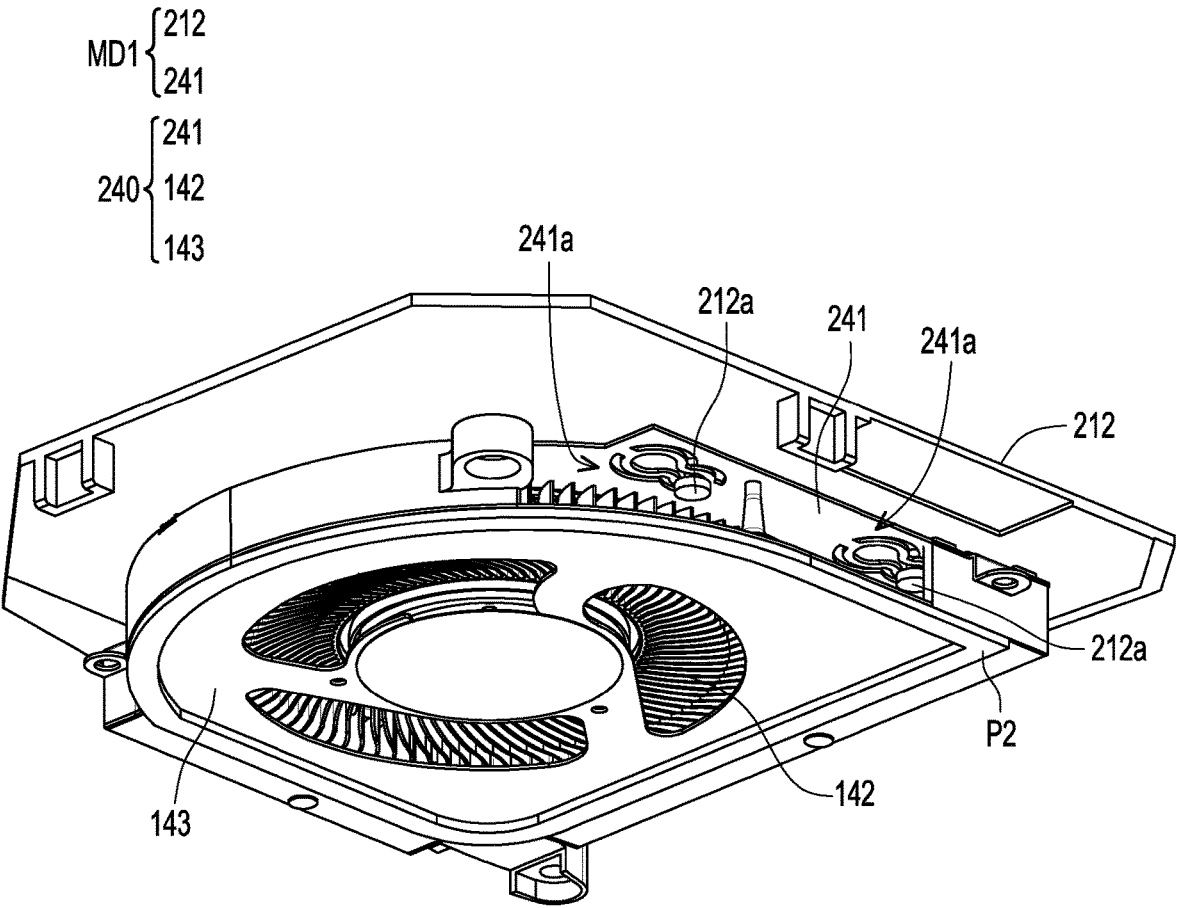
FIG. 4A is a schematic view of a fan and a movable door according to another embodiment.
Figure 4B:
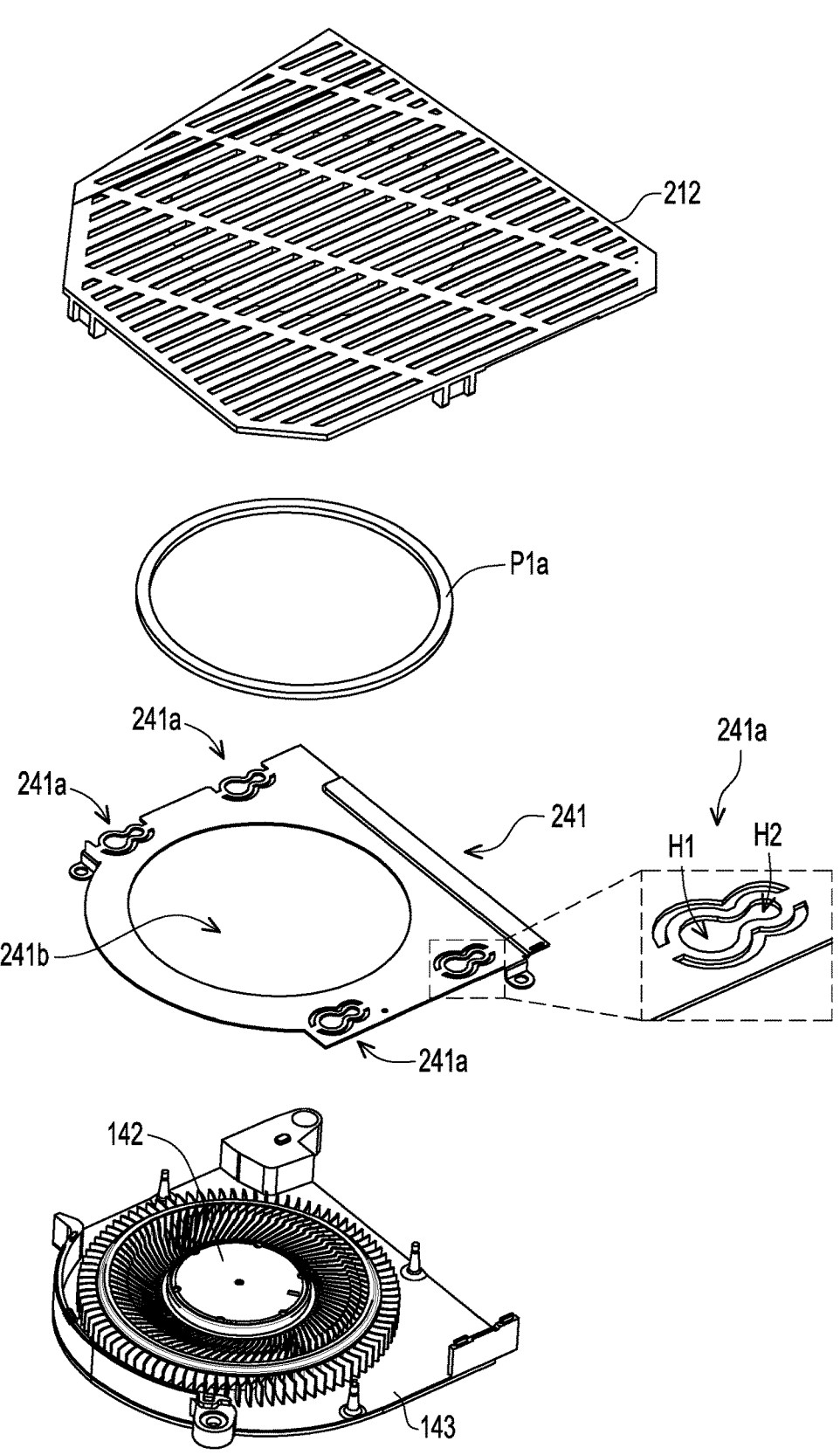
FIGS. 4B and 4C are exploded views of components in FIG. 4A from different perspectives.
Figure 4C:
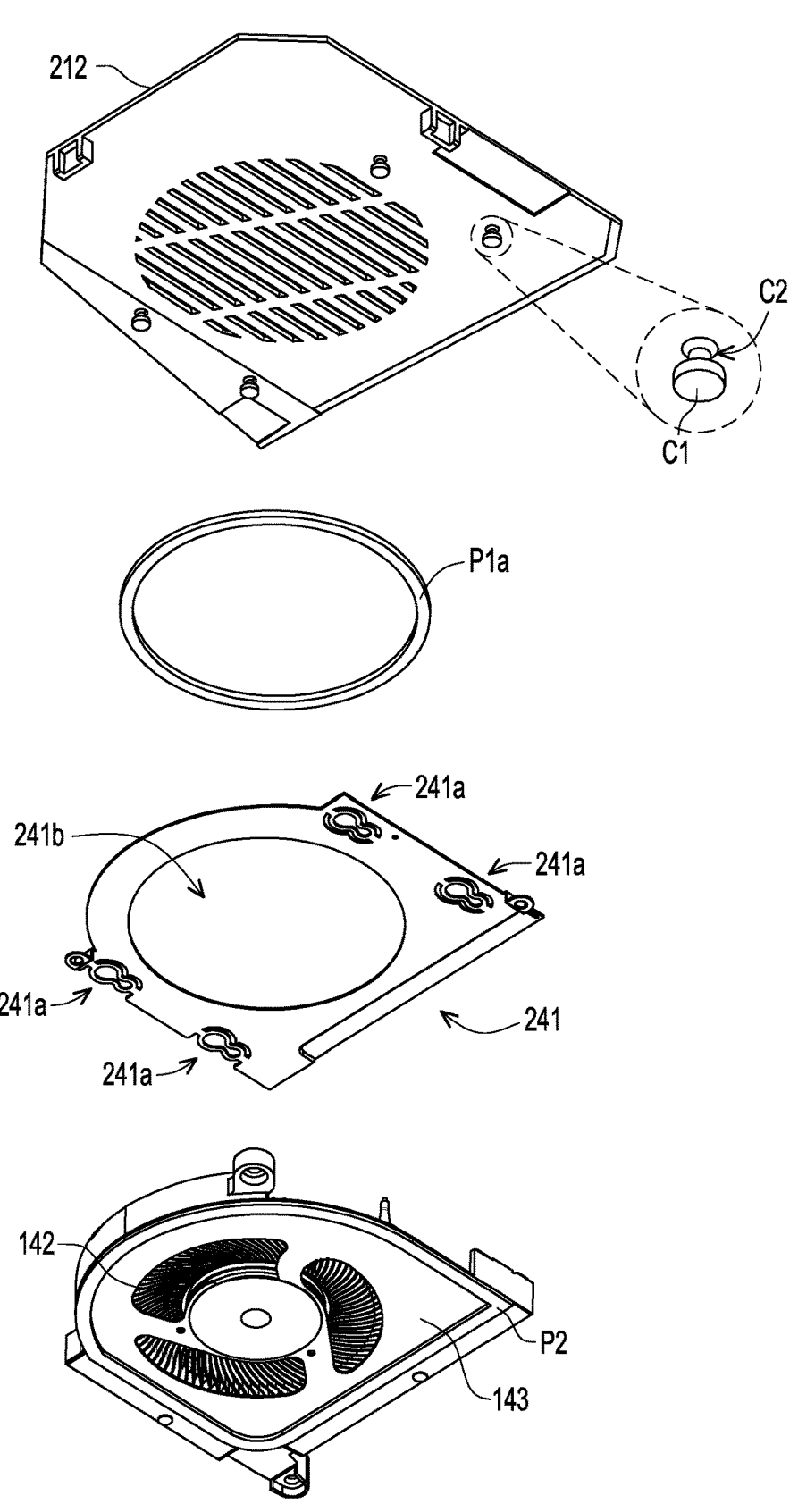

FIG. 4A is a schematic view of a fan and a movable door according to another embodiment. FIGS. 4B and 4C are exploded views of components in FIG. 4A from different perspectives. Referring to FIGS. 4A to 4C together, a difference from the previous embodiments is that the movable doors in this embodiment are fixedly connected to each other, and a first door member 212 is assembled to or disassembled from the host 110 through a latch structure. Relative positions of the host 110 and the first door member 212 are the same as those in the previous embodiment. Therefore, in this embodiment, the host 110 is not shown in the drawings, and a second door member 241 is fixedly connected to an inner side of the first door member 212, so that the second door member 241 may be assembled to or disassembled from the base 143 of the fan 140 when the first door member 212 is disassembled or assembled by the user. In addition, it should also be mentioned that the same components or structures in this embodiment and the previous embodiments are marked with the same reference numerals, and the content thereof has been seen in the description of the previous embodiments.

Further, as shown in FIGS. 4B and 4C, the first door member 212 has multiple convex pillars with unequal diameters, including a neck portion C2 with a smaller outer diameter and a head portion C1 with a larger outer diameter, and the second door member 241 has multiple gourd holes 241*a*, including an inner hole H1 and an inner hole H2 communicating with each other. An inner diameter of the inner hole H1 is greater than an inner diameter of the inner hole H2. The inner diameter of the inner hole H1 is greater than the outer diameter of the head portion C1. The outer diameter of the head portion C1 is greater than the inner diameter of the inner hole H2. The outer diameter of the neck portion C2 is less than the inner diameter of the inner hole H2. In this way, the convex pillars with the unequal diameters are adapted to be inserted into the inner hole H1 of the gourd hole 241a, and then moved to the inner hole H2, so that due to a corresponding relationship between the inner diameter and the outer diameter, the convex pillars with the unequal diameters may be buckled in the inner hole H2 to fix the second door member 241 and the first door member 212 together. In this way, the first door member 212 and the second door member 241 that are fixedly connected to each other may be driven by the user to be disassembled from the host 110, so that the impeller 142 is exposed from the host 110 as in the previous embodiment, which facilitates the cleaning operation.

Furthermore, in this embodiment, a buffer member P1a is further included, abutting between the first door member 212 and the second door member 241, and surrounding an opening 241b (that is, equivalent to one of the air inlets of the fan) of the second door member 241, so that a gap between the first door member 212 and the second door member 241 is kept equidistant.

Figure 5A:
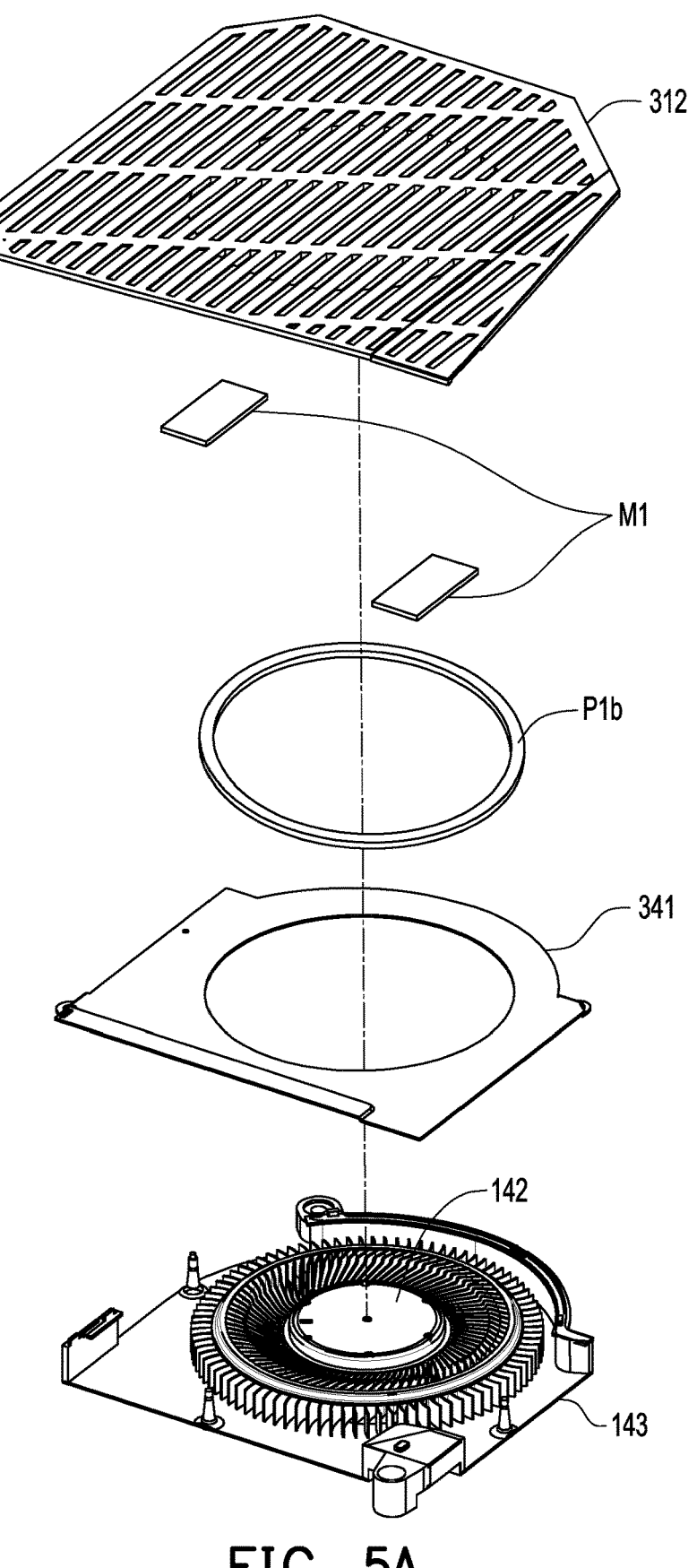
FIG. 5A is an exploded schematic view of a fan and a movable door according to another embodiment.
Figure 5B:
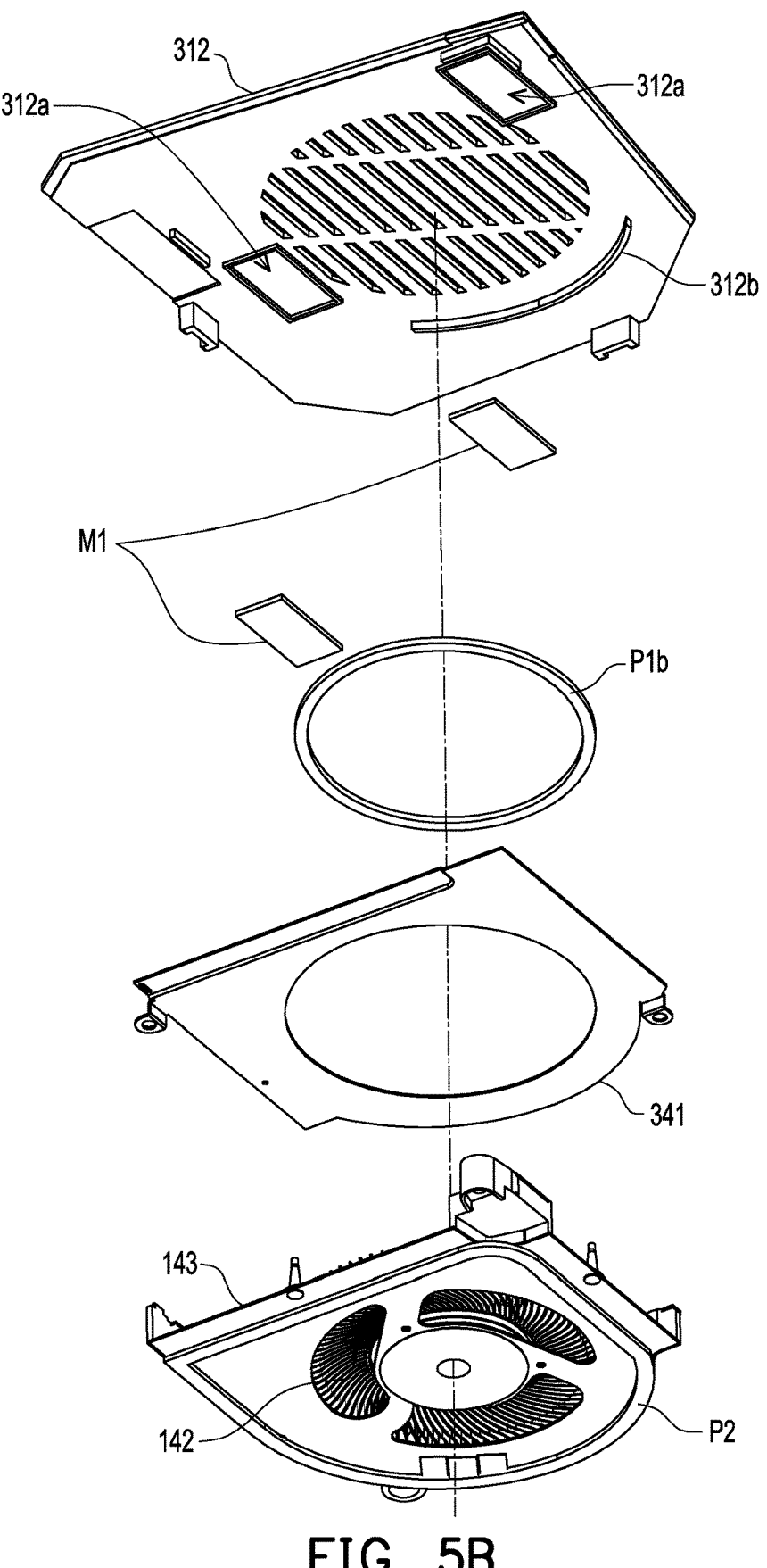
FIG. 5B shows components in FIG. 5A from another perspective.

FIG. 5A is an exploded schematic view of a fan and a movable door according to another embodiment. FIG. 5B shows components in FIG. 5A from another perspective. Referring to both FIGS. 5A and 5B, compared to the embodiments shown in FIGS. 4A to 4C, a first door member 312 and a second door member 341 fixed to each other are also adopted for the movable door in this embodiment, but a difference is a fixing means. In this embodiment, at least one of the first door member 312 and the second door member 341 is formed by a magnetic material, and at least one magnetic member (take two magnetic members M1 as an example) is further included in this embodiment, so as to magnetically attract and fix the first door member 312 and the second door member 341 together through the magnetic member M1. As shown in FIG. 5B, the first door member 312 has multiple grooves 312a to accommodate the magnetic member M1. Similarly, in this embodiment, a buffer member P1b is included to abut between the first door member 312 and the second door member 341 to maintain an equidistant gap. In addition, the first door member 312 in this embodiment further limits the buffer member P1b through a convex rib 312b.

Figure 6:
FIG. 6 is a simple schematic view of a fan and a movable door according to another embodiment.

FIG. 6 is a simple schematic view of a fan and a movable door according to another embodiment. Similarly, in this embodiment, the same reference numerals represent the same structures or components as described above. Referring to FIG. 6, different from the foregoing movable door which is formed by two door members, the movable door in this embodiment only has a single door member 412, which substantially forms a part of the second surface S2. Furthermore, as shown in FIG. 6, the door member 412 in this embodiment is detachably assembled on the second surface S2 of a host 410, and a disassembly means may refer to the foregoing embodiments. Of course, in this embodiment, a pivot means of the foregoing first door member 112 may also be adopted to connected to the host 410. As shown by an arrow in the figure, the fan in this embodiment is also a centrifugal fan. After the air enters through an axial inlet, the air will be discharged in a radial direction to dissipate heat from heat dissipation modules 420 (such as a heat dissipation fin) and 430 (such as a heat pipe).

In addition, the movable door (the door member 412) in this embodiment is pressed against a peripheral side of the base 143 through the buffer member P1, and the host 410 is located inside a structure of the first surface S1 to be pressed against the base 143 through another buffer member (that is, the buffer member P2) and away from the peripheral side. In this way, the user may clean the impeller 142 after opening the door member 412 from the host 410. In this embodiment, through the single door member 412, a thickness of the host 410 may be effectively reduced to facilitate slimming of a machine body.

Based on the above, in the embodiments of the disclosure, the laptop computer is provided with the movable door on the second surface of the host, and the fans disposed in the host is covered by the movable door. Accordingly, the user may easily operate the movable door to cover the fan or remove it from the fan. After the movable door is removed, the impeller of the fan may be exposed from the host via the second surface, and the user may perform the required cleaning operation on the impeller to improve heat dissipation efficiency of the fan.

In one embodiment, the movable door may be formed by two door members, and the pivot means is adopted to allow one of the door members to be pivoted to the host, and the other door member to be pivoted to the base of the fan, while allowing the side of the two door members away from the pivot end are slidably coupled to each other, so that the two door members may be pivoted to be unfolding or pivoted to be folding synchronously. In one embodiment, the movable door may be formed by two door members, and the two door members are fixedly connected to each other, and the fixing means may be to fix by pillars, hole structures, or magnetic attraction according to requirements. But no matter which one, it may smoothly expose the impeller from the second surface with a simple structure.

In an embodiment, the movable door is only formed by a single door member, and the connection means between the movable door and the host may be selected according to the foregoing embodiments, and also has the effect of exposing to the impeller from the second surface by opening the movable door.

In other words, due to the configuration of the movable door on the second surface, the host may provide a simple mechanism for the user to clean the fan, and the user does not need to worry about the complicated process of disassembling and assembling the host structure affecting the sense of operation and experience.

What is claimed is:

1. A laptop computer, comprising: a host having a first surface and a second surface opposite to each other; a movable door disposed on the second surface; a display pivoted to the host to be folding on the first surface or unfolding from the first surface; an input module disposed on the first surface;

and a fan disposed in the host, wherein the movable door covers the fan, and after the movable door is removed from the fan, an impeller of the fan is exposed from the host via the second surface, wherein the movable door comprises: a first door member pivoted to the host; and a second door member pivoted to the fan, wherein an end portion of the second door member away from the pivoted fan is constantly and slidably coupled to the first door member, a gap is between the first door member and the second door member, and when the first door member is unfolding relative to the second surface, the first door member drives the second door to open together relative to the second surface and expose the impeller; wherein the fan further comprises a base including a plurality of positioning holes, the second door member has a plurality of positioning pillars, and the second door member is fixed to the base through the positioning pillars and the positioning holes being locked correspondingly to each other.

2. The laptop computer according to claim 1, wherein the fan is a centrifugal fan, and the second door member has one of air inlets of the centrifugal fan.

3. The laptop computer according to claim 1, wherein the impeller is rotatably disposed on the base, and the second door member is pivoted to the base.

4. The laptop computer according to claim 1, further comprising a buffer member abutting between the first door member and the second door member, wherein when the movable door is folding on the second surface, the first door member presses the second door member through the buffer member.

5. The laptop computer according to claim 1, wherein the host has an arc track, and the first door member is movably pivoted to the arc track.

6. The laptop computer according to claim 1, wherein the gap is a non-equidistant gap.

7. The laptop computer according to claim 1, wherein the first door member has a pair of limiting protrusions, and two opposite sides of the second door member are movably coupled to the pair of limiting protrusions.

8. The laptop computer according to claim 1, wherein the movable door comprises:

a first door member detachably assembled to the host to form a part of the second surface; and a second door member assembled on an inner side of the first door member, wherein a gap is between the first door member and the second door member, and the second door member is assembled to or disassembled from the host along with the first door member.

9. The laptop computer according to claim 1, wherein the fan has a base, the impeller is rotatably disposed on the base, the movable door is pressed against a peripheral side of the base through a buffer member, and the host is located inside a structure of the first surface to be pressed against the base through another buffer member and away from the peripheral side.

10. The laptop computer according to claim 4, wherein the second door member has a groove accommodating a part of the buffer member.

11. The laptop computer according to claim 8, wherein the first door member has a plurality of convex pillars with unequal diameters, the second door member has a plurality of gourd holes, and the convex pillars with the unequal diameters are adapted to be moved and buckled in the corresponding gourd holes, so that the second door member and the first door member are fixed together.

12. The laptop computer according to claim 8, further comprising a magnetic member, wherein at least one of the first door member and the second door member is formed by a magnetic material, so that the first door member and the second door member are magnetically attracted and fixed together through the magnetic member.

13. The laptop computer according to claim 8, wherein the fan is a centrifugal fan, and the second door member has one of air inlets of the centrifugal fan.

14. The laptop computer according to claim 8, wherein the fan further comprises a base, the impeller is rotatably disposed on the base.

15. The laptop computer according to claim 8, further comprising a buffer member abutting between the first door member and the second door member, and the gap is an equidistant gap.

* * * * *